(12) United States Patent
de Raad et al.

(10) Patent No.: US 12,021,076 B2
(45) Date of Patent: Jun. 25, 2024

(54) TRANSISTOR SWITCHES WITH ELECTROSTATIC DISCHARGE PROTECTION

(71) Applicant: NXP B.V., Eindhoven (NL)

(72) Inventors: Gijs Jan de Raad, Bemmel (NL); Denizhan Karaca, Nijmegen (NL)

(73) Assignee: NXP B.V., Eindhoven (NL)

( * ) Notice: Subject to any disclaimer, the term of this patent is extended or adjusted under 35 U.S.C. 154(b) by 428 days.

(21) Appl. No.: 17/450,179

(22) Filed: Oct. 7, 2021

(65) Prior Publication Data

US 2023/0115302 A1   Apr. 13, 2023

(51) Int. Cl.
*H01L 27/02* (2006.01)

(52) U.S. Cl.
CPC ...... *H01L 27/0266* (2013.01); *H01L 27/0255* (2013.01)

(58) Field of Classification Search
CPC . H01L 27/02; H01L 27/0266; H01L 27/0255; H01L 27/027; H03K 17/102; H02H 9/00
USPC ......................................... 361/56, 91.1, 111
See application file for complete search history.

(56) References Cited

U.S. PATENT DOCUMENTS

| | | | |
|---|---|---|---|
| 6,404,269 B1 | 6/2002 | Voldman | |
| 9,202,620 B2 | 12/2015 | Fan et al. | |
| 9,373,955 B2 | 6/2016 | Chen | |
| 9,406,695 B2 | 8/2016 | Shapiro et al. | |
| 10,797,994 B1 | 10/2020 | Burgener et al. | |
| 10,804,892 B2 | 10/2020 | Dribinsky et al. | |
| 2004/0212936 A1* | 10/2004 | Salling | H01L 27/0277 361/111 |
| 2004/0212937 A1* | 10/2004 | Marholev | H01Q 1/50 361/56 |
| 2006/0001100 A1* | 1/2006 | Kamei | G06F 30/367 257/355 |
| 2010/0001347 A1 | 1/2010 | Sugiura | |
| 2014/0227983 A1* | 8/2014 | Clausen | H03K 17/162 455/78 |
| 2015/0137246 A1* | 5/2015 | Shapiro | H01L 28/20 257/350 |
| 2017/0272066 A1 | 9/2017 | Scott et al. | |
| 2019/0229109 A1* | 7/2019 | Ritter | H01L 27/0629 |
| 2020/0235089 A1 | 7/2020 | Stockinger et al. | |

* cited by examiner

*Primary Examiner* — Danny Nguyen
(74) *Attorney, Agent, or Firm* — Jonathan J. Sapan

(57) ABSTRACT

Field effect transistors in an electronic switching device are provided with electrostatic discharge (ESD) protection elements electrically coupled to a first current terminal of each transistor (e.g., a source of each transistor or a drain of each transistor), allowing the electronic switching device to withstand ESD-induced currents without damage to the switching device.

18 Claims, 11 Drawing Sheets

US 12,021,076 B2

TRANSISTOR SWITCHES WITH ELECTROSTATIC DISCHARGE PROTECTION

BACKGROUND OF THE INVENTION

Field of the Invention

This invention relates to transistor-based electronic switching devices with protection from electrostatic discharge-induced damage.

Background

Radio-frequency switches are devices configured to allow signal paths between devices such as radio transmitters, radio receivers, and other devices such as amplifiers and the like to selectively enabled and disabled (i.e., electrically coupled and electrically decoupled). Such switches may also be used to dynamically route and re-route radio-frequency signals. RF switching technologies include mechanical and electronic switching devices. Transistor-based switches using one or more transistors represent one class of electronic switches. One class of transistor based switches employ field-effect transistors (FETs).

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, where:

FIG. 4A illustrates the device withstanding an ESD event and FIG. 4B illustrates a failure mode.

DETAILED DESCRIPTION

Figure 1:
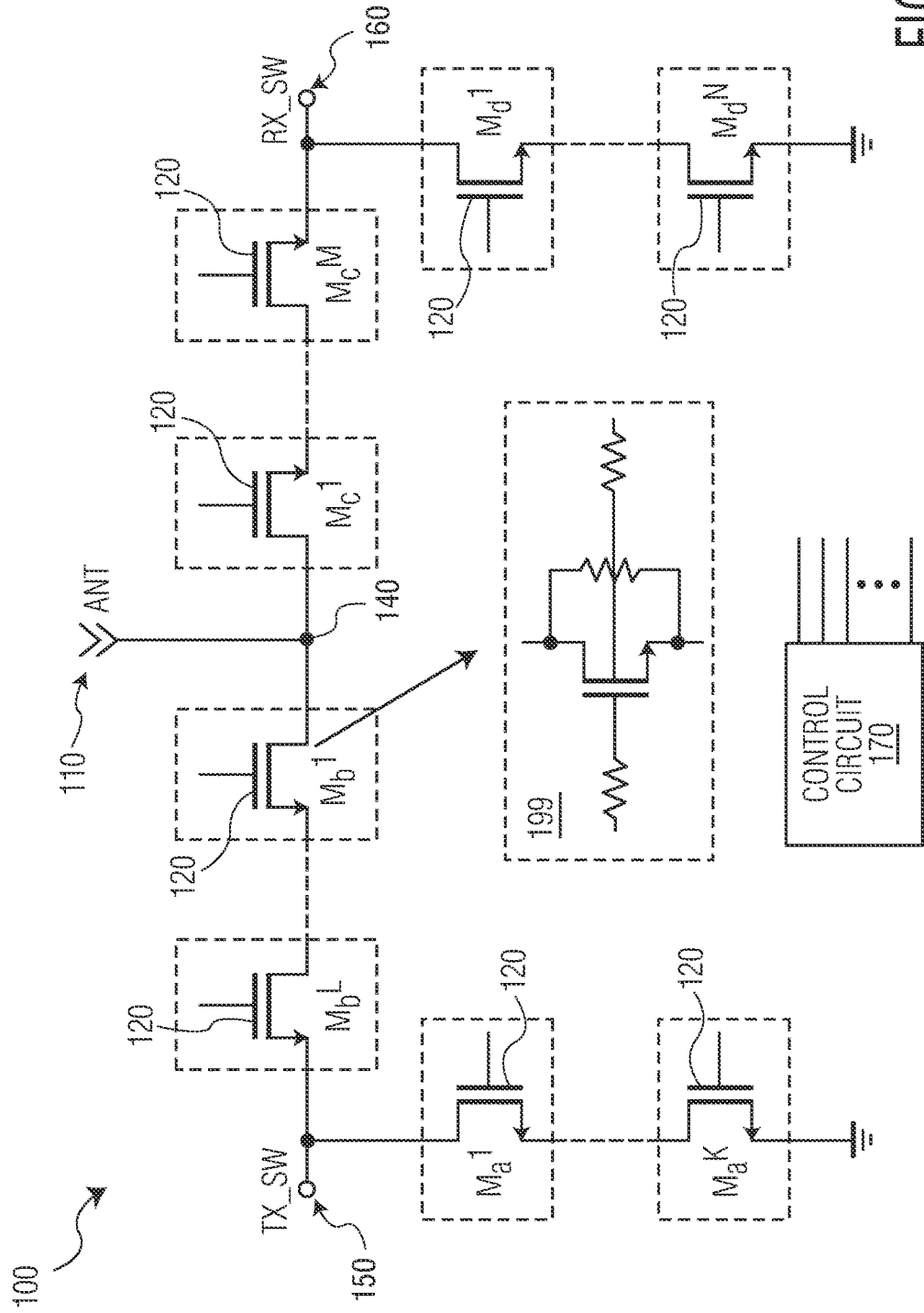
FIG. 1 is a schematic diagram of an example transistor-based switching circuit coupled to an antenna.

The following detailed description is exemplary in nature and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

It will be understood that references to directions of electrical current herein follow the convention that electrical current flows from a larger electric potential to a lower electric potential defined according to the potential energy of a positively charged object or particle. It will be further understood that when reference is made to the electrical resistances between two points that such electrical resistances may be determined by application of a suitable test current and measurement of a voltage between those two points. Alternatively, electrical resistances described herein may be determined by applying a fixed voltage between two points and measuring an amplitude of a resulting electric current between those two points.

It will be understood that examples referring to devices fabricated using particular semiconductor technologies (e.g., bulk silicon MOSFETs) are intended for purposes of illustration only and are not intended to exclude the use of other technologies including silicon-on-insulator (SOI), MIS-FETs, non-silicon FETs, etc.

In alternating current circuits, including those operating at radio and microwave ("RFMW," ~10 kHz-100 GHz) frequencies, n-channel MOSFETs ("nMOS FETs," "n-MOS-FETs," or "nFETs") are sometimes used to switch signals on or off at desired circuit nodes, or to route the signals along different paths in the IC. These switches can be implemented as shunt switches where the signal is shunted to a ground or low-voltage connection point, or as series switches which can either block the signal or let it pass. The switches are controlled by gate control signals that are coupled to the gates of the individual transistors, may also be controlled in some devices by additional body control signals coupled to bodies of the individual transistors (e.g., if the transistors are fabricated using silicon-on-insulator techniques).

Some RFMW integrated circuits use nMOS transistors as switches (see FIG. 1 as an example). To handle typical input voltage levels, these transistor switches are often arranged in series "stacks" of multiple switches to manipulate RFMW signals. It is desirable to protect these switches against electrostatic discharge (ESD) that may occur during manufacturing and handling. Furthermore, it can be desirable that these devices are inherently resistant to ESD damage because the addition of conventional ESD-protection devices will often reduce RFMW performance (e.g., by introducing losses that reduce the effective bandwidth). However, many conventional methods of providing built-in ESD protection may be undesirable in circuits intended for operation at RFMW frequencies because high-frequency performance may be reduced. For instance, silicide blocking, a well-known technique for providing ESD protection for nMOS transistors may not always be suitable for RFMW switching devices. Instead, fully silicided nMOS transistor switches with many narrow fingers and short gate lengths are often used. However, this approach may be error prone, because not all combinations of design parameters work equally well for providing ESD protection.

In addition, the ESD behavior of a stack of switches deteriorates as the number of switches in the stack increases. Consequently, there is often a very narrow "sweet spot" in the design parameter space in which transistor-based switch stacks are effectively self-protected from ESD damage. If one or more of the design parameters falls outside of this sweet spot region, the stack will fail during ESD testing, sometimes already at very low ESD test voltages. The problem is compounded by the fact that the ESD behavior of such switch stacks cannot be simulated by circuit simulators, often forcing a trial and error approach. Furthermore, some ESD damage may not be immediately apparent and will instead manifest as premature failure after extended use.

Embodiments herein provide reliable ESD protection for a wide range of transistor designs for RFMW switching applications by integrating protective circuitry that ensures activation of the parasitic bipolar junction in n-channel FETs in response to ESD events, without compromising RFMW performance, as described further below.

Thus, in one or more embodiments an electronic switching device includes an input terminal, an output terminal, and at least first and second field effect transistors. The first field effect transistor (FET) has a first current terminal, a second current terminal, a channel region between the first current terminal and the second current terminal, and a body region. The first FET is configured to provide a first conductive current path between the input terminal and the second current terminal of the first FET via the channel region of the first FET. The second FET is connected in series with the first FET between the input terminal and the output terminal and has a first current terminal, a second current terminal, a channel region between the first current terminal and the second current terminal of that FET, and a body region. The second FET is configured to provide a second conductive current path between the second current terminal of the first FET and the output terminal via the channel region of the second FET. The electronic switching device has a first electrostatic discharge (ESD) protection circuit coupled to the first current terminal of the first FET and the body region of the first FET; and a second ESD protection circuit coupled to the first current terminal of the second FET and the body region of the second FET.

In one or more embodiments, the first ESD protection circuit may also be electrically coupled to the second current terminal of the first FET such that the first ESD is coupled between the first and second current terminals and the first FET and the body of the first FET. In one or more embodiments, the second ESD protection circuit may also be coupled to the second current terminal of the second FET such that the second ESD is electrically coupled between the first and second current terminals of the second FET and the body of the second FET.

FIG. 1 shows an example switching circuit 100 that includes FETs 120 configured as RF switches to selectively electrically couple (and/or electrically decouple) an antenna 110 to transmitter circuitry (not shown) that may be connected to a transmit terminal (TX terminal 140) of the switching circuit 100. The switching circuit 100 includes 1 to L FETs $\{M_1^b, \ldots, M_L^b\}$ between the transmit terminal (TX terminal 150) and the antenna input/output terminal 140, depending on the expected signal level. The circuit 100 may also include 1 to K FETs $\{M_1^a, \ldots, M_K^a\}$ which may be placed in the on state to shunt signals from the transmitter circuitry to ground when the transmitter is electrically decoupled from the antenna 110 using the transistors $\{M_1^b, \ldots, M_L^b\}$ between the TX terminal 150 and the antenna terminal 140. Similarly, the antenna 110 may be electrically coupled or electrically decoupled from receiver circuitry (not shown) connected to a receive terminal (RX terminal 160). The switching circuit 100 includes 1 to M FETs 120 $\{M_1^c, \ldots, M_M^c\}$ to carry RF signals from the antenna terminal 140 to the receive terminal 160. The circuit also includes 1 to N FETs 120 $\{M_1^d, \ldots, M_N^d\}$ to selectively ground the RX terminal 160. Each FET 120 may be provided with bias resistors as shown in the inset circuit diagram 199. The gate and body of each transistor may be biased via the bias resistors by a control circuit 170.

Figure 2:
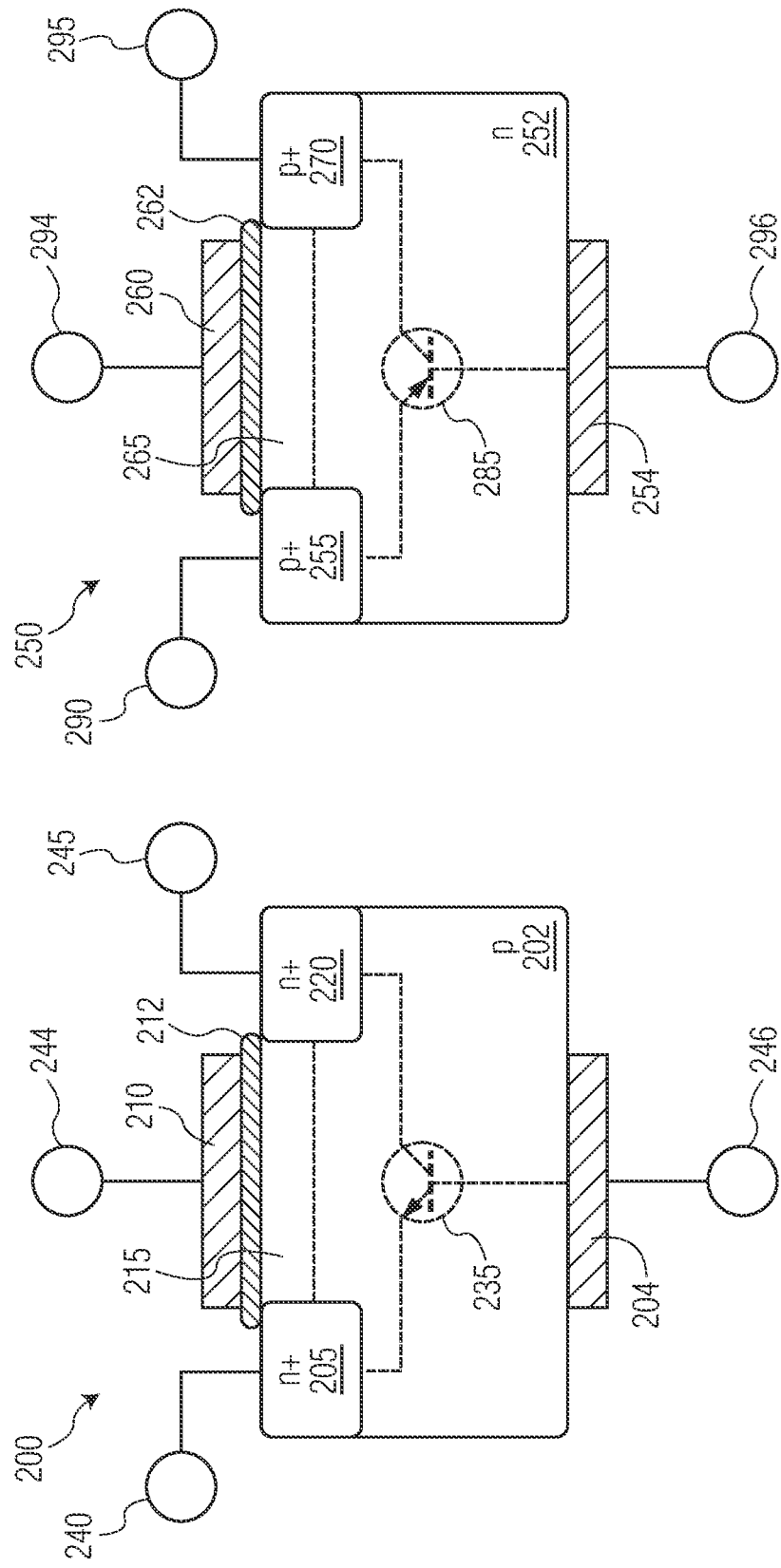
FIG. 2A is a simplified cross-sectional schematic of an nMOS field effect transistor.
FIG. 2B is a simplified cross-sectional schematic of a pMOS field effect transistor.

FIG. 2A depicts a n-channel field effect transistor (an "nFET" suitable for use as one of the FETs 120, for example) in order to illustrate concepts relevant to the following descriptions. The nFET 200 is formed within a volume of p-type silicon or other semiconductor material, which may be referred to interchangeably herein as the body 202 or the substrate 202 of the nFET 200. The nFET 200 has a first current terminal 240 connected to a n-doped well 205 and a second current terminal 245 connected to an n-doped well 220. The first current terminal 240 and the second current terminal 245 may be referred to interchangeably as source and drain wells according to the convention that the direction of current flow between is from source to drain, or any other suitable convention. The nFET 200 also has a control terminal 244 connected to a gate electrode 210 separated from the body 202 by an insulating layer 212. Upon application of a suitably positive voltage to the control terminal 244, an electrically-conductive channel 215 is formed between the two n-doped wells 205, 220 that allows current to flow between the first current terminal 240 and the second current terminal 244. When the insulating layer 212 is an oxide, the nFET 200 may be referred to as metal-oxide-semiconductor FET ("MOSFET"); otherwise, the nFET 200 may be referred to as a metal-insulator-semiconductor FET ("MISFET"). It will be understood that use the term MOSFET herein is for purposes of illustration and is not intended to limit embodiments to MOSFETs rather than MISFETs or other suitable transistor devices. A transistor such as the nFET 200 may also optionally include a fourth terminal 246 connected to an electrode 204 in contact with the body 202 (i.e., the substrate of the nFET 200 or the body of the nFET 200).

As shown in FIG. 2A, the nFET 200 includes a parasitic bipolar junction transistor structure (the BJT 235). As indicated by dashed lines extending from the BJT 235, the body 202 of the nFET 200 corresponds to the base of BJT 235, while the n-well 205 corresponds the emitter of the of BJT 235 and the n-well 220 corresponds to the collector of the BJT 235. It will be appreciated that the choice of which n-well corresponds to the emitter of the BJT 235 and which n-well corresponds to the collector and which n-well corresponds to the emitter of the BJT 235 may be determined conventionally by the direction of current flow or any suitable convention and that, in the absence of any current, this choice is arbitrary. It will also be appreciated that embodiments using n-channel transistors are described as non-limiting examples and that nothing herein is intended to limit embodiments to the use of n-channel transistors.

Accordingly, FIG. 2B depicts a p-channel field effect transistor (a "pFET"). The pFET 250 is fabricated within a volume of n-type silicon or other semiconductor material, which may be referred to interchangeably as the body 252 or the substrate 252 of the pFET 250. The pFET 250 has a first current terminal 290 connected to a n-doped well 255 and a second current terminal 295 connected to an p-doped well 270. The first current terminal 290 and the second current terminal 295 may be referred to interchangeably as source and drain wells according to the convention that the direction of current flow between is from source to drain, or any other suitable convention. The pFET 250 also has a control terminal 294 connected to a gate electrode 260 separated from the volume 252 by an insulator 262. Upon application of a suitably negative voltage to the control terminal 294, an electrically-conductive channel 265 is formed between the two p-doped wells 255, 270 that allows current to flow between the first current terminal 290 and the second current terminal 294. When the insulating layer 262 is an oxide, the pFET 250 may be referred to as metal-oxide-semiconductor FET ("MOSFET); otherwise, the pFET 250 may be referred to as a metal-insulator-semiconductor FET ("MISFET"). A transistor such as the pFET 250 may also optionally include a fourth terminal 296 connected to an electrode 254 in contact with the volume 252 (i.e., the substrate of the pFET 250 or the body of the pFET 250).

As shown in FIG. 2B, the pFET 250 includes a parasitic bipolar junction transistor structure (the parasitic BJT 285). As indicated by dashed lines extending from the BJT 285, the body 252 of the pFET 250 corresponds to the base of BJT 285, while the p-well 255 corresponds the emitter of the of BJT 285 and the p-well 270 corresponds to the collector of the BJT 285. It will be appreciated that the choice of which of the p-wells 255, 270 corresponds to the emitter of the BJT 285 and which of the p-wells 255, 270 corresponds to the collector of the BJT 285 may be conventionally determined by the direction of current flow or any suitable convention and that, in the absence of any current, this choice is arbitrary.

It will be further understood that in some embodiments, the body (or substrate) of a transistor may be grounded or electrically coupled to ground via an electrically-resistive connection, while the body may be left floating in other embodiments. In still other embodiments, the body may be biased to any suitable electrical potential. In both the transistor 200 and the transistor 250, the corresponding BJT 235, 285 may be biased into an on state when an appropriate current flows to or from the base of that BJT. This may be achieved by applying supplying a bias to the substrate via the electrode 204 or the electrode 254, to bias the body the corresponding transistor. In addition, currents flowing between the source (or drain) of each transistor 200, 250 and the resistive body 202, 252 of that transistor may result in an electric potential gradient within that transistor body 202, 252 that biases the base of the corresponding BJT 235, 285 into an active operating mode. Embodiments herein exploit parasitic BJTs (e.g., the BJT 235 or the BJT 285) to provide ESD protection as will be described further below.

Figure 3:
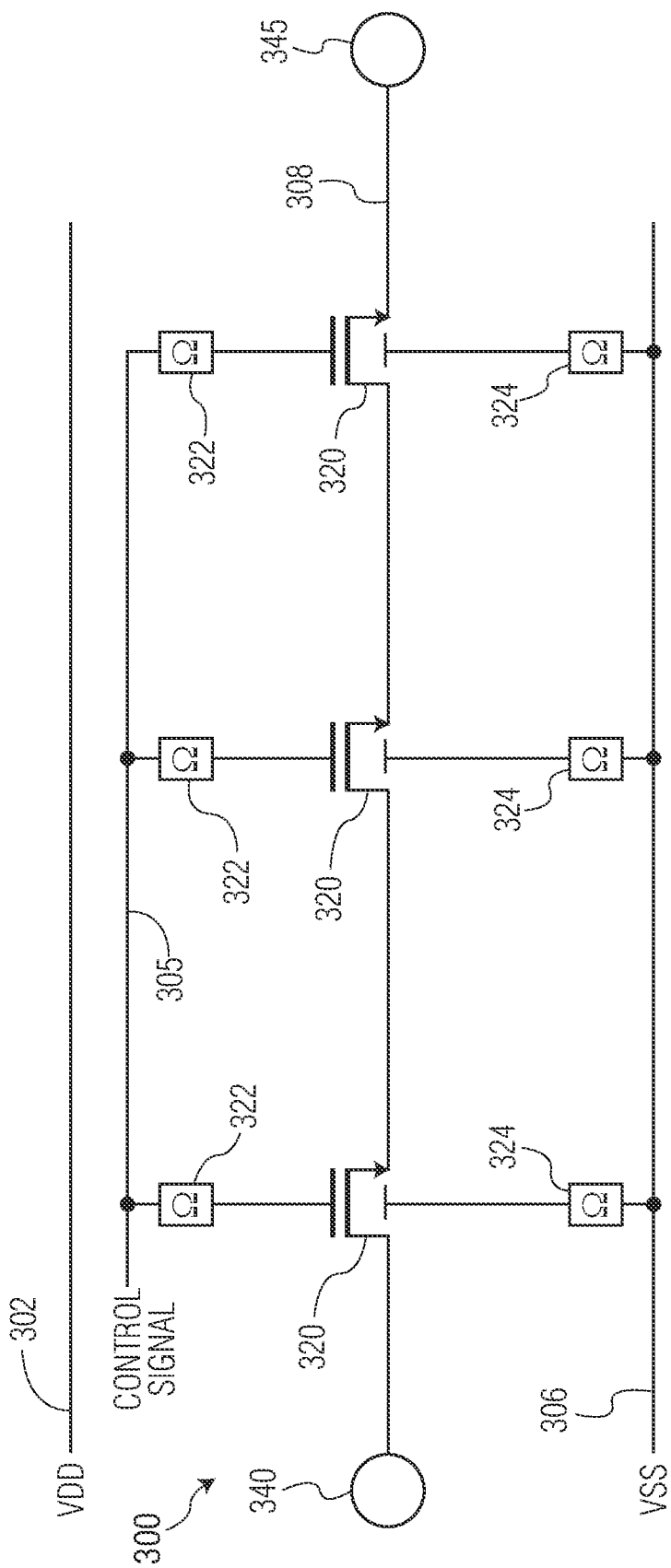
FIG. 3 is a simplified circuit diagram of a switching device that includes three transistors in series.

FIG. 3 is a schematic illustrating an example switching circuit 300 that includes three FETs 320 in series (e.g., any of the arms of the switching circuit 100 of FIG. 1, such as the transistors 120 $\{M_1^a, \ldots, M_K^a\}$, $\{M_1^b, \ldots, M_L^b\}$, $\{M_1^c, \ldots, M_L^c\}$, or $\{M_1^d, \ldots, M_N^d\}$ where K, L, M, or N is equal to three). The circuit 300 includes a positive supply voltage line 302 ('$V_{DD}$'), a current line 308 (i.e., a source line or a drain line) that includes the three FETs 320 and a negative or low bias line 306 ('$V_{SS}$'), as well as a control signal line 305 coupled to the gate of each FET 320 (which may be used to selectively electrically couple or electrically decouple the gate of that FET 320 to the positive bias line 305 via control circuit (e.g., the control circuit 170) to switch the FETs 320 on or off as desired. Also shown are gate bias resistors 322 and body bias resistors 324. When each of the FETs 320 are biased in an active state (i.e., an 'on' state), the switching circuit 300 allows current to flow from a first current terminal 340 to a second current terminal 345. It will be appreciated that the first current terminal 340 may be referred to as an input terminal and that the second current terminal 345 may be referred to as an output terminal, or vice versa.

One performance characteristic that influences the design of transistor switching circuits (e.g., the example switching circuit 100 or the example switching circuit 200) is the maximum voltage amplitude of the signal(s) to be switched. In many cases this combination forces a switch designed similarly to the example switching circuit 300 of FIG. 3 in which several low-voltage n-MOSFET switches are connected in series. As an example, a single n-MOSFET RF-switch may be limited to a maximum voltage difference of 2 V between source and drain, while the amplitude of an RF signal to be switched might be 20 V, in one nonlimiting example. In this example, ten MOSFETs might be connected in series to provide a reliable switch capable of being exposed to 20 V-peak signal amplitudes without catastrophic failure caused by destructive breakdown of the drain-body (or source-body) pn junction.

Performance requirements for such switching circuits often include a maximum acceptable insertion loss at one or more frequencies, and other/or other requirements on the frequency response. In order to maximize a switching circuit's usable bandwidth, switches used in the signal path between an input terminal and an output terminal need to have minimal parasitic capacitance.

At the same time, switching circuits intended for use at RFMW frequencies, like other integrated circuits, often require protection against ESD damage. A particular challenge when protecting RFMW circuits from ESD is that ESD protection devices often add parasitic capacitance to the pin that they protect and this capacitance degrades RFMW performance of the signal path. Therefore, any pins in an RFMW switching circuit that are part of the AC signal path (that is the pins receiving or transmitting the RFMW signal(s)) should have an ESD protection that has as little internal capacitance as possible (which usually means they are designed as small as possible). From an RFMW performance perspective it may be ideal to have no ESD protection at all on RF signal pins.

Transistors for use in RFMW switches are often wide (ca. 1000 μm), low-voltage n-channel MOSFETs. Depending on the silicon processing technology used, exact details of the switch layout, and sub-type of the nMOS transistor switch, such switches can sometimes be inherently resistant to ESD damage. However, such favorable ESD resistance cannot usually be guaranteed. If switching components can be guaranteed to withstand ESD then other ESD protection techniques can be forgone or scaled back on the RF signal pins (e.g., the RX terminal 140 and/or TX terminal 160 of the switching circuit 100). One benefit is that switching devices can be made smaller (with less parasitic capacitance).

When an RF-switch consisting of a stack of nMOS transistor self-protects against ESD, it often does so by activating the internal, parasitic NPN bipolar junction transistor that is embedded in any nMOS transistor (e.g., the nFET 200). This needs to happen in each nMOS transistor contained in the switch in order for the protection to be effective. It is this internal NPN device (e.g., the BJT 235) that then passes the ESD current from either one of its source/drain terminals to the other one. During the process, the source/drain terminal that is at the highest potential of these two assumes the role of drain, and the source/drain terminal that is at the lowest potential of these two assumes the role of source. Activation of the internal NPN happens when, at the start of the ESD pulse, a small current flows from the source/drain terminal acting as drain into the nMOS transistor body (e.g., the body 202 of the nFET 200). When this current flowing through the body is sufficient to lift the electric potential of the transistor body by about 1 V with respect to the source/drain terminal acting as source, the internal NPN activates.

When an RF-switch consisting of a stack of nMOS transistors self-protects against ESD, it does so by activating the internal, parasitic NPN bipolar junction transistor that is embedded in any nMOS transistor. This needs to happen in each nMOS transistor contained in the switch in order for the protection to be effective. This NPN device then passes the ESD current from either one of its source/drain terminals to the other one. During the process, the source/drain terminal that is at the highest potential of these two assumes the role of drain, and the source/drain terminal that is at the lowest potential of these two assumes the role of source. Activation of the internal NPN happens when, at the start of the ESD pulse, a small current flows from the source/drain terminal acting as drain into the nMOS transistor body. When this current is sufficiently strong to lift the electric potential of the nMOS transistor body by about 1 V with respect to the source/drain terminal acting as source, the internal NPN activates as intended.

During the initial stages of an ESD strike a small amount of current may flow from the source/drain terminal acting as drain to the body of an nMOS transistor, and from there, to the source/drain terminal acting as source. If this current is larger than a critical amount, the parasitic NPN bipolar transistor will be biased in an on state. A portion of the ESD-generated current (a "loss-current") may also flow to the $V_{SS}$ line 406 via the resistive transistor body in transistors with a body/substrate electrode, which does not contribute to activating the BJT. In a typical case, these currents result from internal avalanche breakdown at the drain-body junction (represented as a Zener diode 430 in FIG. 4A and FIG. 4B). There is a maximum amount of current that the drain/body junction can carry without damage to the transistor. There are now two possible scenarios for the response of a switching circuit to an ESD event, illustrated by FIG. 4A and FIG. 4B, respectively.

Figure 4A:
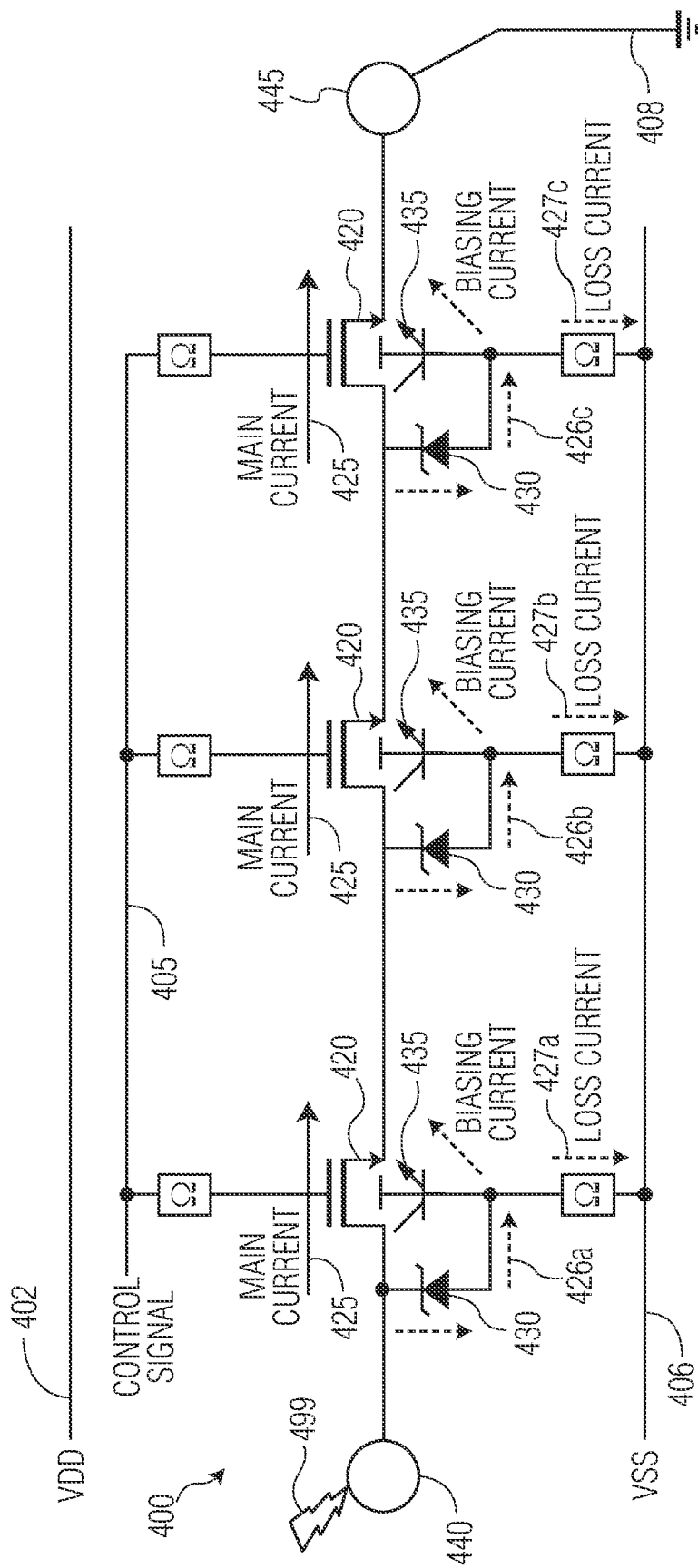
FIG. 4A and FIG. 4B are example circuit diagrams that illustrate the performance of a conventional three-transistor switch similar to the device of FIG. 3 in which ESD protection is provided by the built-in pn junctions formed between a source/drain well of each transistor and the body of that transistor (represented schematically by Zener diodes).

FIG. 4A shows an example circuit diagram 400 corresponding to three-FET switching circuit and notated to illustrate its behavior in response to an electrostatic discharge (ESD 499). In this example, the ESD 499 drives currents (bias currents 426a, 426b, 426c) sufficient to bias the parasitic BJT 435 of each nFET 420. In this example, a "main" electrical current 425 will flow from drain to source of each nFET 420, ultimately sinking the ESD-generated current pulse at the (grounded) output terminal 445. When each parasitic NPN BJT 435 activates, this also tends to protect the drain-body junction of the corresponding nFET 420 from excessive thermal dissipation. This is because the main current 425 passed by each BJT 435 is allowed to flow through a cross section defined by the dimensions of the parasitic BJT 435 and this cross-section is larger than the cross-sectional area defined by the corresponding nFET 420 alone.

Figure 4B:
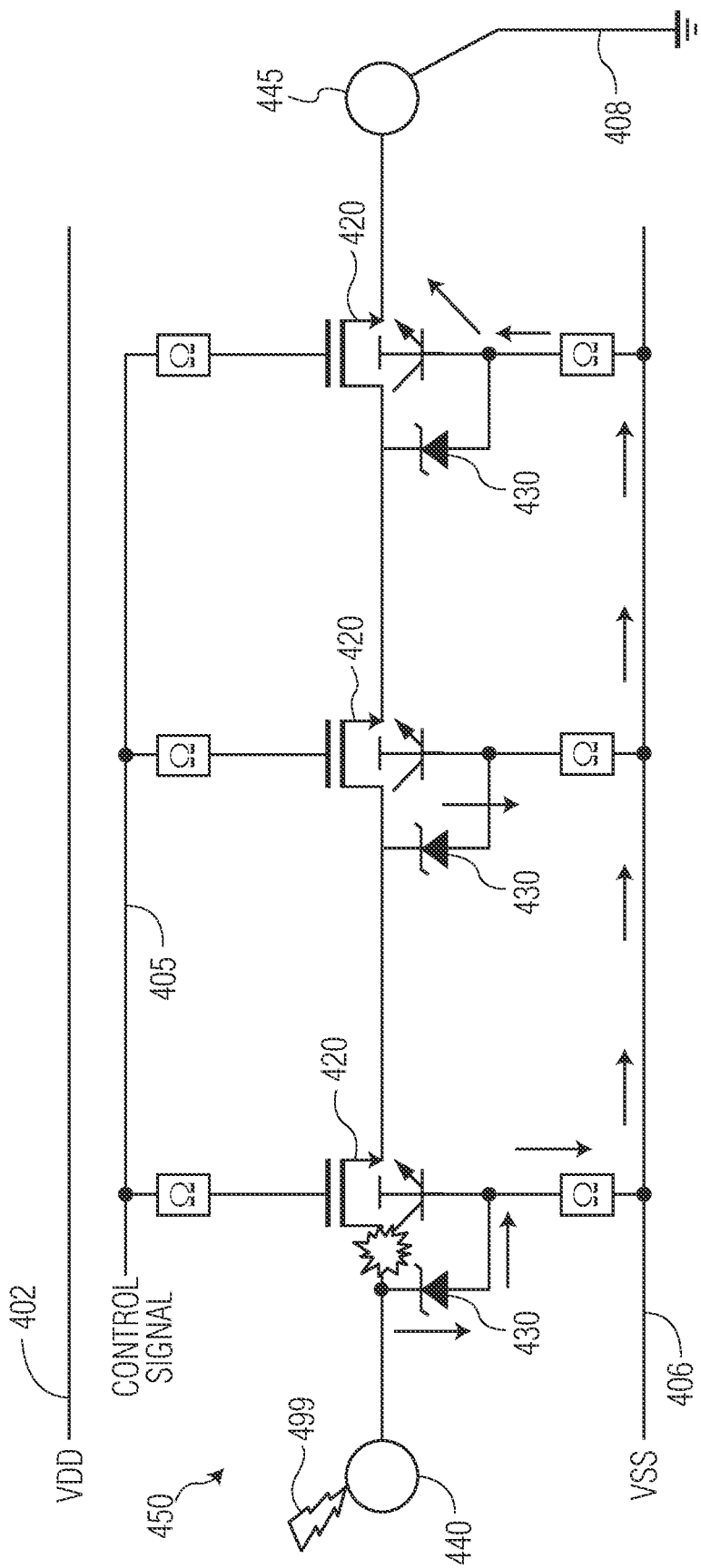

FIG. 4B shows an example circuit diagram 450 of the circuit of FIG. 4A, notated to illustrate the response of the circuit to the ESD 499 in a failure mode. In this example, the internal biasing current is not sufficient to activate one or more of the internal (parasitic) NPN BJTs 435. As a result, there is no current path from the effective input terminal 440 to the effective (grounded) output terminal 445. Instead, the ESD current pulse will force its way through the drain-body junction of the leftmost nFET 420, on to the source of that nFET 420, and then directly to $V_{SS}$ via the resistance tying the body to the $V_{SS}$ connection 406. In this example the current forced through the reverse-biased drain/body junction is greater than the junction can reliably carry and results in current-induced damage to the leftmost nFET 420.

In the example diagram 400 of FIG. 4A, activation of the parasitic NPN BJT 435 corresponding to each nFET 420 (and with that, ESD robustness of the switch itself) will depend on the design of each nFET 420. For example, the cross-sectional area of the pn-junction formed between the drain and body of each nFET 420 must be large enough to safely accommodate the largest expected voltage spike corresponding to the ESD 499. As an example, the so-called human body model (HBM) of electrostatic discharge models the source of an ESD as a 100 pF capacitor discharged through a 1.5 kΩ resistor. Different degrees of ESD can then be modeled using various peak voltage levels (e.g., 2 kV, 4 kV, 6 kV, 8 kV, and so on) which in turn induce an ESD current in the device which may be characterized by a peak value (e.g., a 1.5 Ampere peak current). Embodiments herein may be characterized by a peak current value a switching device may withstand. Embodiments herein may also be characterized by a maximum voltage applied by a test circuit that stimulates ESD, such as a circuit designed according to the HBM in which the 100 pF resistor is charged by the voltage source and then discharged through a 1.5 kΩ in series with the device under test (DUT). Thus, as a nonlimiting example, if the 100 pF capacitor is charged to 2 kV and produces peak current of 1.5 A, the DUT may be said to withstand either a 2 kV discharge or a 1.5 A peak current according to the HBM.

The HBM described above is one suitable model of measuring the ESD-tolerance of embodiments herein. Another suitable model is the machine model (MM) in which a voltage source charges a 200 pF series resistor which is then discharged through a 0.5 nH inductor to the DUT. Another example is the charged device model (CDM). A DUT such as switching circuit according to embodiments herein may be characterized by a voltage applied according one of the above models or any other suitable model or a corresponding peak current level experienced by the DUT that is expected to result.

For example, in a charged device model (CDM) test, a voltage source may be connected to a resistor having a large resistance value (e.g., >10 MΩ) in contact with a fixture coupled to the DUT (e.g., to the substrate of a transistor-switching circuit in embodiments herein) after which one or more pins of the DUT are grounded. A DUT such as a switching circuit in embodiments herein may be characterized by the peak voltage applied in accordance with the CDM, or a resulting peak current level. As an example, an applied voltage of 500 V may result in a peak current of ~6 A over an interval of 1-2 ns.

While it is possible to design transistors with large enough junctions to withstand damage and/or to protect these transistors with sufficiently large capacitances, such design choices may be undesirable for performance reasons and/or economic reasons. As one example, larger transistors will occupy more area on a wafer, leading to reduced circuit density and therefore higher costs per component.

Along these lines, electronic switching devices used for RFMW signals may be characterized by various figures of merit including, as an example, the product of the electrical resistance between input and output terminals when the device is in an 'on' or 'closed' state that allows signals to pass from input to output (denoted $R_{ON}$) and the capacitance of the device when the device is in an 'off' or 'closed' state that blocks signals from passing from the input to the output (denoted $C_{OFF}$). According to some embodiments an electronic switching device may have a value of ($R_{ON} \times C_{OFF}$) that is equal to or less 350 femtoseconds with an ESD endurance of at least 1.5 Amperes. According to some embodiments an electronic switching device may have a value of ($R_{ON} \times C_{OFF}$) equal to or less than 100 femtoseconds with an ESD endurance of at least 1.5 Amperes.

Furthermore, larger transistors with increased capacitance may also be less desirable due to the reduction in RFMW performance (e.g., decreased operating bandwidth as measured by the full-width half maximum of the frequency-dependent gain or insertion loss of the device, or measured using any other suitable technique). As another example, FETs designed for low-voltage operation (e.g., 1.5 V maximum drain-source bias) tend to conduct current via the parasitic BJT more easily than those designed for higher voltage operation (e.g., 3.0 V). But selecting low-voltage FETs may require placing a greater number of FETs in series, depending upon the intended operating voltage of a switching circuit. The ease with which a FET conducts current via the parasitic BJT mode can also depend on the geometry of the FET (e.g., the number of fingers the shapes of the fingers, gate widths) and other factors, including the layout of body contacts, if any).

Additionally, the resistances between the control voltage source and the transistor gates, as well as resistances between the transistor bodies and $V_{SS}$ play a role in determining the AC performance of switching devices. Such effects and others above place limits on design freedom available when optimizing a switch stack for desired RFMW performance. Embodiments herein can mitigate these effects, thereby increasing design freedom for transistor-based switch stacks.

Figure 5A:
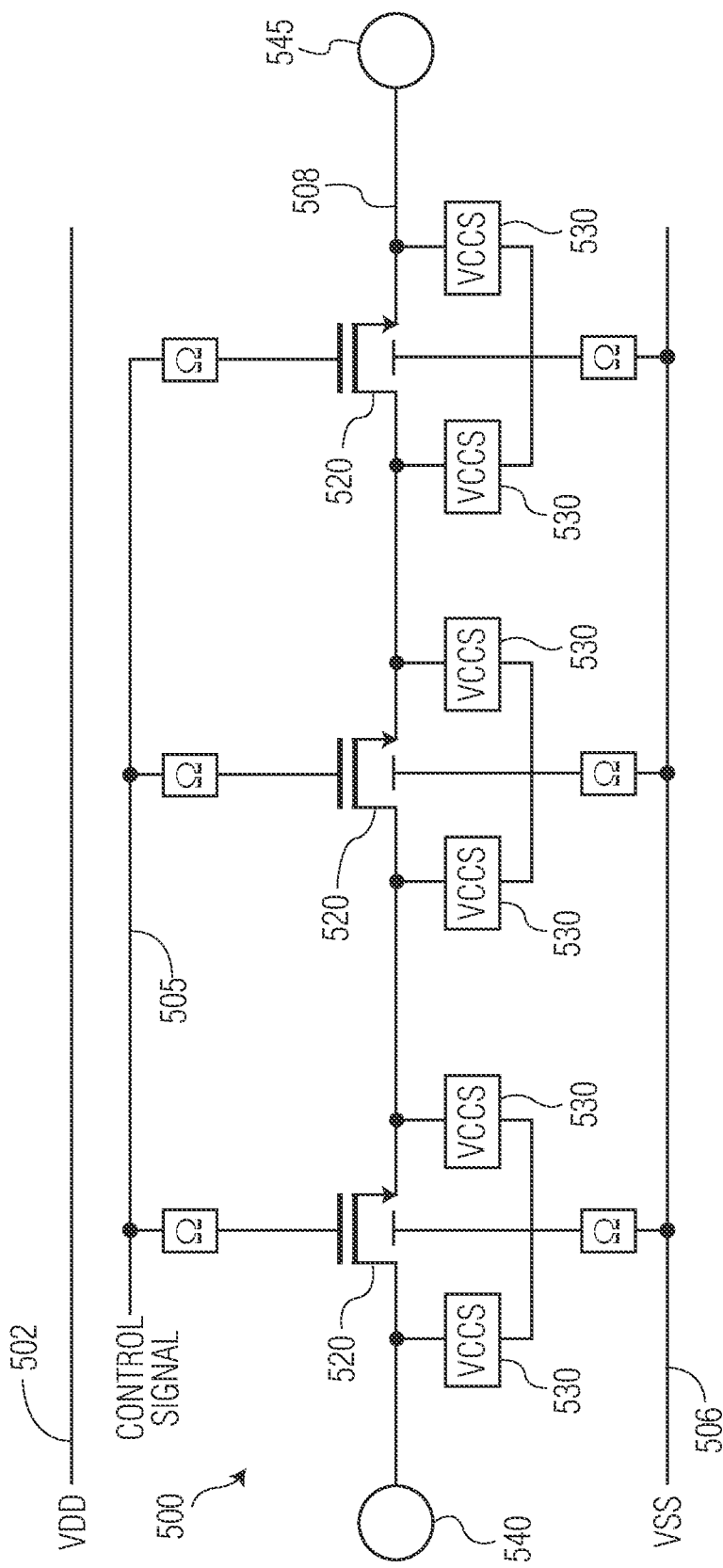
FIG. 5A is a simplified circuit diagram of a switching device similar to the device of FIG. 3 in that includes voltage controlled current sources to provide protection against electrostatic discharges (ESD) according to embodiments herein.
Figure 5B:
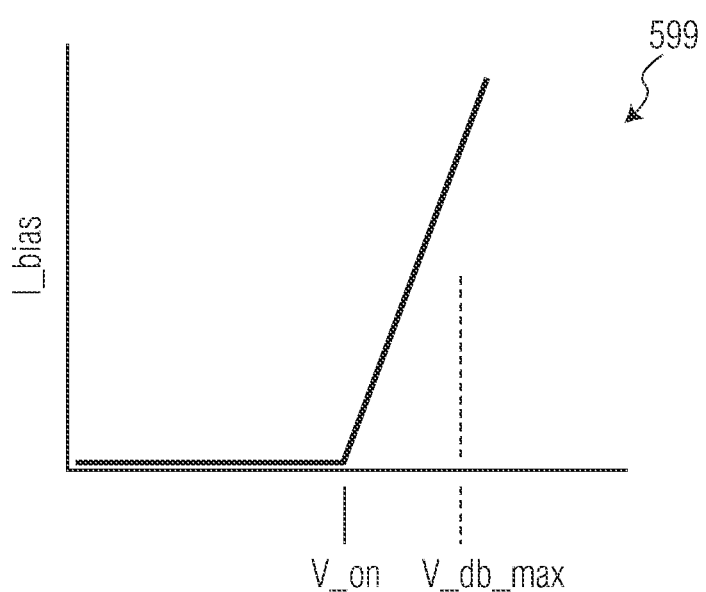
FIG. 5B is a plot of an example current-voltage transfer characteristic of a VCCS suitable for use in embodiments herein.

FIG. 5A and FIG. 5B illustrate certain aspects of embodiments herein that address challenges described above. FIG. 5A shows an example switching circuit 500 configured to pass RF signals between two input/output ports 540, 545. It will be understood that the circuit 500 isbidirectional, and thus, the ports 540, 545 may each be described interchangeably as an input port or an output port. Similarly, each FET 520 may be described as having first and second current terminals, each of which may be described interchangeably as either a source or a drain depending upon the voltages applied to the input/output ports 540, 545. As shown, the example switching circuit 500 includes three FETs 520 in series with each other to form a signal path 508 between the input/output ports 540, 545 when the FETs 520 are in an on state in which a conductive path exists between source and drain. According to embodiments herein, the first and second current terminals (i.e., both source and drain) of each FET 520 is electrically coupled to a voltage-controlled current source (a VCCS 530). In this example, VCCS has a voltage-to-current transfer characteristic similar to the example transfer characteristic 599 shown in FIG. 5B, and described further below. Although each FET 520 is shown with a VCCS 530 at each of its first and second current terminals, it should be understood that this is for purposes of illustration only and that, in some embodiments, an FET 520 may be provided with a VCCS electrically coupled only to the first current terminal or only to the second current terminal of that FET 520.

Each VCCS 530 in the embodiment pictured in FIG. 5A and each similar element in other embodiments is configured such that it is inactive below a certain voltage ($V_{ON}$). When the voltage across a particular VCSS 530 is at or above $V_{ON}$, that VCCS 530 supplies a current that flows from the drain (or source) of the corresponding transistor 520 toward a negative voltage supply (or ground) connection (e.g., the $V_{SS}$ connection 506). Each VCCS 530 is configured such that the VCCS 530 has a voltage $V_{ON}$ which it starts supplying current (or the current-voltage transfer characteristic has an inflection point above which the current supplied increases more rapidly with increasing voltage). According to embodiments herein the voltage $V_{ON}$ is lower than a voltage threshold beyond which the reverse-biased drain-body junction of the transistor 520 is likely to be physically damaged ($V_{DB,max}$). One nonlimiting example of a suitable VCSS is one or more diodes in series (e.g., the diode chains 630 of FIG. 6). Another nonlimiting example is a Zener diode having a suitable reverse breakdown voltage. It will be understood that any circuit or device which allows current to flow from a source or drain terminal of an FET 520 when a sufficiently large potential difference exists between that terminal and the body region of that FET 520.

Figure 6:
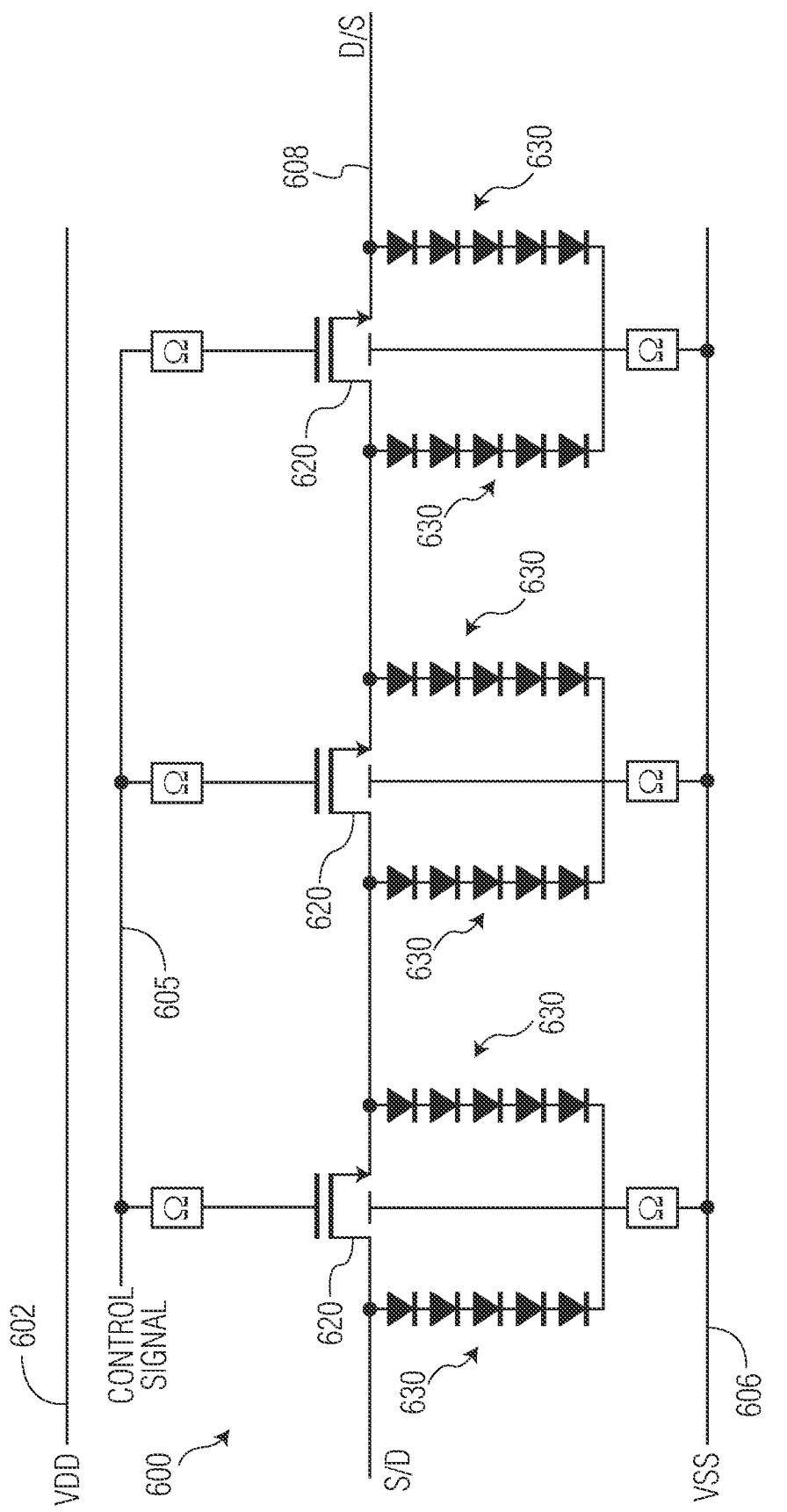
FIG. 6 is simplified circuit diagram illustrating a switch related to the device of FIG. 5A in which sets of diodes provide ESD protection according to embodiments herein.

FIG. 6 is a circuit diagram of an example three-transistor switching circuit 600 in which the VCCS function describe above is implemented with diode chains 630. As shown, each transistor 620 has a diode chain 630 between the first current terminal and the body of that transistor 620 as well as another diode chain 630 between the second current terminal and the body. However, it will be understood that in some embodiments, each transistor may only have a diode chain between one terminal of that transistor and its body (e.g., each transistor may have a diode chain between the first current terminal and the body of that transistor or, alternatively, between the second current terminal of that transistor and its body).

Figure 7B:
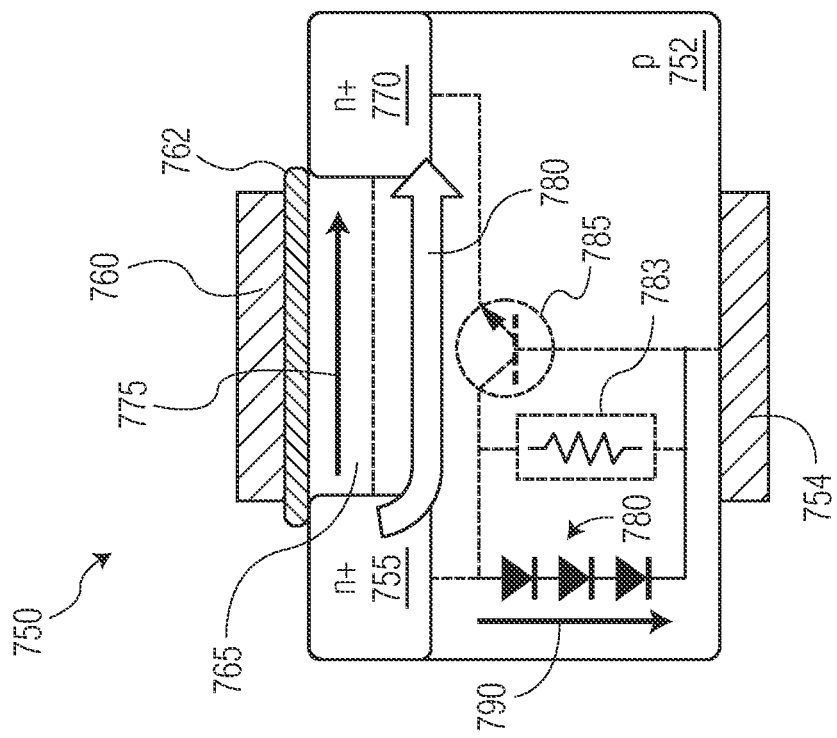
FIG. 7B is a schematic depiction of current flow in a FET similar to the FET of FIG. 8A in response to an ESD event when the FET in FIG. 7A is provided with ESD protection according to embodiments herein.
Figure 7A:
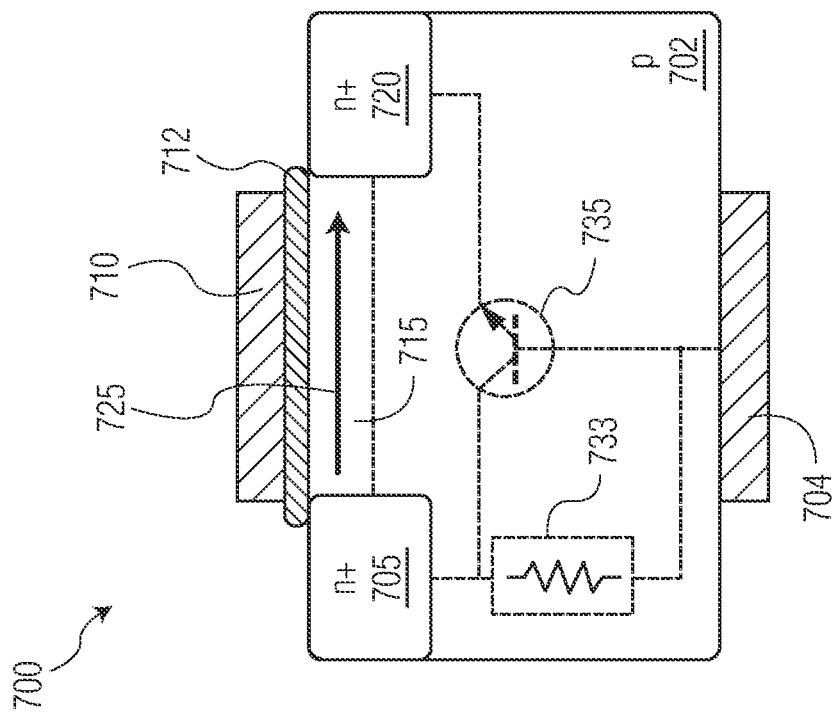
FIG. 7A is a schematic depiction of current flow in a single field effect transistor in a normal operating mode.

FIG. 7A and FIG. 7B together illustrate the operation of an nFET suitable for use in embodiments herein in two modes: a first mode in which the nFET conducts current in an FET mode without activation of a parasitic BJT, and a second mode in which the nFET conducts current via the parasitic BJT.

FIG. 7A is a cross-sectional schematic view of an nFET 700. The nFET 700 has n-doped source/drain wells 705 and 720 formed in a p-type body region 702 (or substrate 702). A gate electrode 710 is disposed above the body region 702 between the two source/drain wells and separated from the body region 702 by a gate oxide 712 (or another dielectric). When an appropriate control signal is applied to the gate electrode 710, a conductive channel region 715 is formed through which a current 725 may flow when the source/drain wells 705, 720 are appropriately biased. The nFET 700 also has a body electrode 704 in contact with a bottom of the body region 702. Also shown is a parasitic BJT 735 with dashed lines indicating that the body region 702 forms the base of the BJT 735 and the source/drain wells 705, 720 form the base and collector of the BJT 735. The bulk resistance of the body 702 is represented by a resistor 733. The parasitic BJT 735 can be activated by application of an appropriate bias voltage to the body electrode 704 or if a current flows in the body that creates a sufficient voltage drop to activate the BJT 735.

FIG. 7B shows a cross-sectional schematic view of an nFET 750 related to the nFET 700. The nFET 750 is provided with a diode chain 780 (e.g., a diode chain 630) according to embodiments herein. The nFET 750 has n-doped source/drain wells 755 and 770 (e.g., the source/drain wells 705, 720) formed within a body region 752 (or a substrate 752). Analogously to the nFET 700, the nFET 750 has a gate electrode 760 (e.g., the gate electrode 710) with a gate oxide 762 (or other dielectric), and a body electrode 754 (e.g., the body electrode 704). The parasitic BJT 785 is shown with dashed lines indicating the relationship between the terminals of the parasitic BJT and the parts of the nFET 750 (i.e., the base of the BJT 785 corresponds to the body region 752 and the collector and emitter of the BJT 785 correspond to the source/drain wells 755, 770). The resistor 783 represents the bulk resistance of the body region 752.

As shown in FIG. 7B, the nFET 750 may conduct a current 775 within a channel region 765 when an appropriate control signal is applied to the gate electrode 710 and an appropriate bias is applied between the source/drain wells 755, 770. The channel 765 (like the channel 725) of the nFET 700 exists within a thin layer near the surface of the body region 752 closest to the gate electrode 760. The depth of the channel 765 depends upon the carrier concentration (either intrinsic or doped) of the body region 752 and the strength of the electric field near the gate electrode 760.

The diode chain 780 is configured such that, when a potential difference between the source/drain well 755 exceeds a critical value, a current 790 flows from the source/drain well 755 through the diode chain 780 into the body region 752 in order to ensure that the BJT 785 is activated, allowing a current 780 to flow from the source/drain well 755 to the source/drain well 770 via the body region 752. It will be understood that because, contact area between the source/drain wells 755, 770 and the body region 752 are larger than the contact areas between the source/drain wells 755, 770 and the channel 765 (when formed by application of an appropriate control signal to the gate electrode 760), that the current 780 will tend to be higher than the current 775 might be in response to the same effective bias between the source/drain wells 755, 770. This allows the nFET 750 (conducting current in a parasitic BJT conduction mode) to pass an ESD-driven current pulse without experiencing destructive breakdown at the source-body junction or the drain-body junction.

Although only one diode chain 780 is pictured in FIG. 7B, it will be understood that, according to some embodiments, the nFET 750 may be provided with an additional diode chain 780 electrically coupled to the source/drain well 770 in order to protect the nFET 750 from ESD potentials experienced at the source/drain well 770 as well as at the source/drain well 755. Although the diode chain 780 is pictured schematically within the body region 752 of the nFET 750, it will be understood that the diode chain 780 need not be formed within the body region 752 and can be formed in an adjacent volume within the same semiconductor substrate, as one non-limiting example.

Figure 8A:
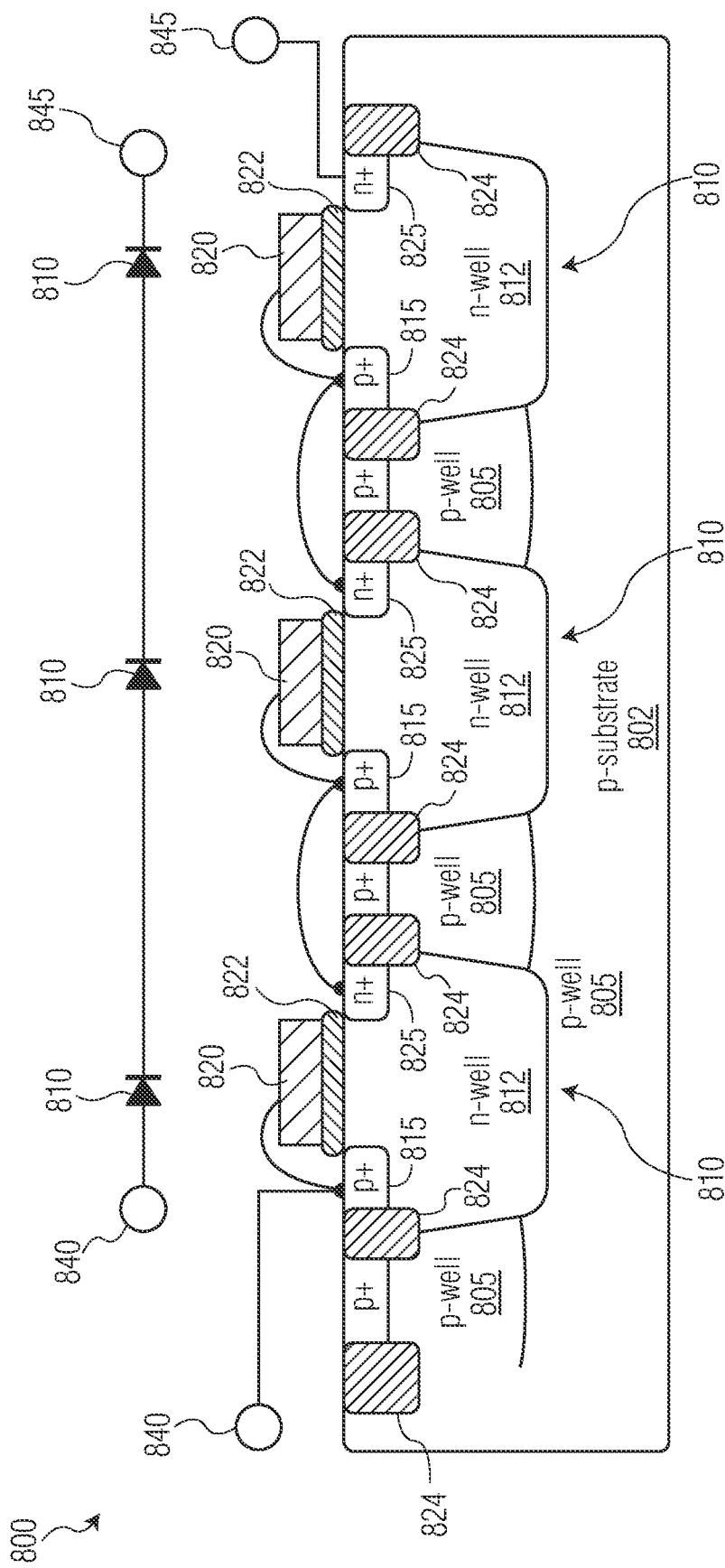
FIG. 8A and FIG. 8B are cross-sectional schematic diagrams of devices suitable for use as diodes in the device of FIG. 6 according to embodiments herein.

FIG. 8A shows a circuit diagram and cross-sectional schematic view of an example diode chain 800 formed within a bulk semiconductor substrate (e.g., a silicon wafer) suitable for use in embodiments herein. As shown, the diode chain 800 has a first current terminal 840 and a second current terminal 845, with three diodes 810 connected in series between them. The diodes 810 are formed within a p-type semiconductor substrate 802 such (e.g., a p-type silicon wafer). Each diode 810 includes a p-doped well 815 and a heavily n-doped well 825 formed within an n-type well 812. Each diode 810 is isolated from each other diode 810 and the substrate 802 by neighboring p-doped wells 805 and shallow-trench isolation regions 824 (e.g., dielectric material deposited within trenches etched in the substrate 802). The diodes 810 are gated diodes, each having a gate 820 tied to the p-well 815 (e.g., using metalized traces and/or bond wires) and separated from the substrate 802 and n-well 812 by a gate dielectric layer 822. Viewed from left to right in FIG. 8A, the n-well 825 of the first diode 810 is tied to the p-well 815 of the second diode 810. Similarly, the n-well 825 of the second diode 810 is tied to the p-well 815 of the third diode 810. The p-well 815 of the first diode 810 is tied to the terminal 840 and the n-well 825 of the third diode 810 is tied to the terminal 845.

Figure 8B:
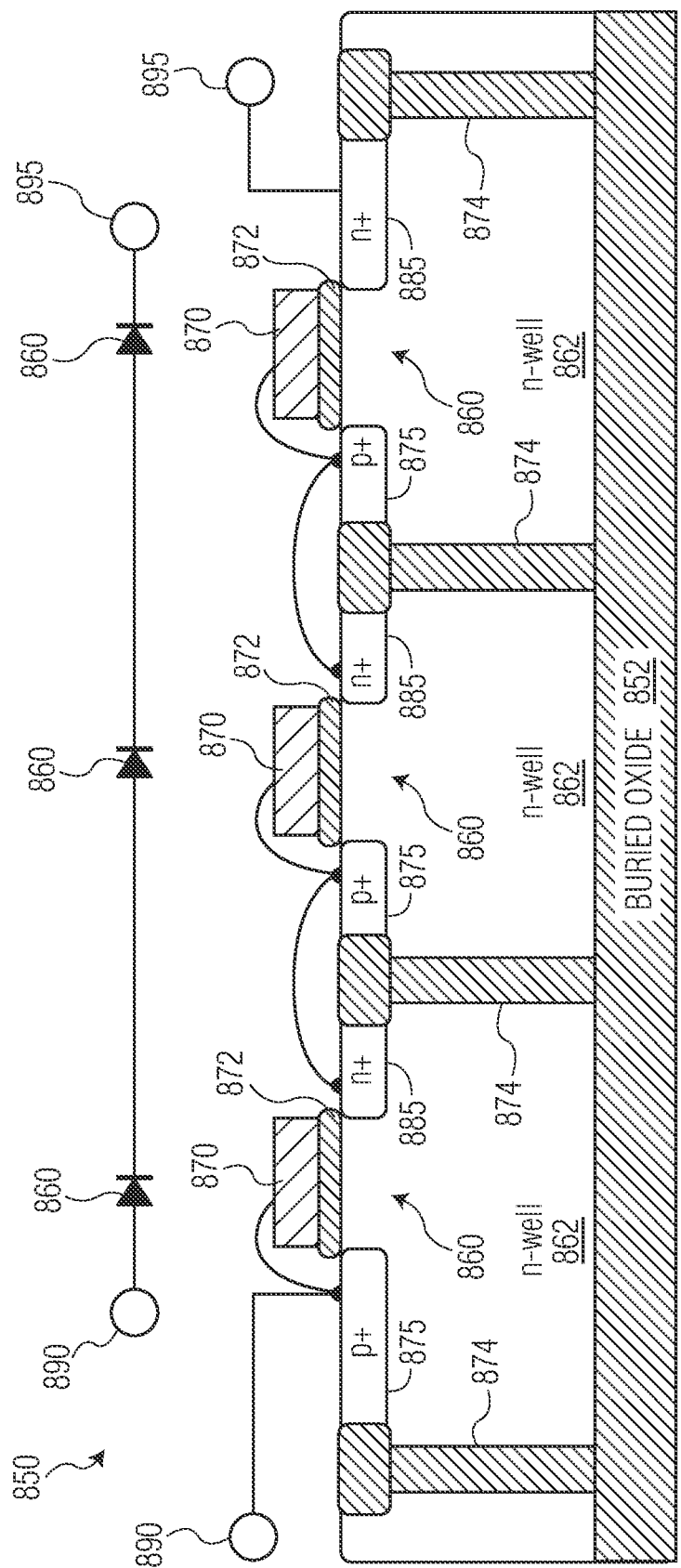

FIG. 8B shows a circuit diagram and cross-sectional schematic view of an example diode chain 850 formed within a semiconductor volume an insulator (e.g., in a silicon layer of a silicon-on-insulator substrate) suitable for use in embodiments herein. As shown, the diode chain 850 has a first current terminal 890 and a second current terminal 895, with three diodes 860 connected in series between them. The diode chain 850 is analogous to the diode chain 810 but is fabricated using semiconductor-on-insulator technology (e.g., silicon-on-insulator, or "SOI").

As shown, the diode string 850 has a first current terminal 890 and a second current terminal 895, with three diodes 860 connected in series between them. The diodes 860 are formed within n-type wells 862 above an insulating layer (e.g., a buried oxide layer 852 on a silicon substrate which is not shown, or any other suitable substrate). Each diode 860 includes a p-doped well 875 and a heavily n-doped well 885. Each diode 860 is isolated from each other diode 860 by the buried oxide layer 852 and trench isolation regions 874 (e.g., dielectric material deposited within etched trenches adjacent to each n-well 862). The diodes 860 are shown as gated diodes, each having a gate 870 tied to the p-well 875 of that diode 860 (e.g., using metalized traces and/or bond wires) and separated from the corresponding n-well 862 by a gate dielectric layer 872. Viewed from left to right in FIG. 8B, the n-well 885 of the first diode 860 is tied to the p-well 875 of the second diode 860. Similarly, the n-well 885 of the second diode 860 is tied to the p-well 875 of the third diode 860. The p-well 875 of the first diode 860 is tied to the terminal 890 and the n-well 885 of the third diode 860 is tied to the terminal 895.

The diode chains 800, 850 are each shown including three diodes and diodes 810, 860 are shown as gated diodes for purposes of illustration only. It will be understood that any suitable number of diodes and any suitable type(s) of diodes may be used according to embodiments herein.

Each VCCS element described above (e.g., each VCSS 530, each diode chain 630, or each diode chain 780), is configured to cause current to flow parallel to the drain-body junctions of the corresponding switching transistors (e.g., transistors 520, 620, 720) during the initial stages of an ESD event. As a result, a larger internal current flow can be supported with each transistor without damaging the drain-body junction (when compared with current limits when the transistor operates purely as a conventional FET). This increased current tolerance enables greater design freedom when designing transistor-based switching circuits. For instance, lower values for the resistances between transistor gates and gate and circuitry to drive those gates may be used. Similarly, lower resistance values may be used between the transistor bodies and $V_{SS}$. Furthermore, switches with higher voltages than might have otherwise been practical can be considered (thereby increasing overall component density) because ESD protection can be ensured. More generally, an additional margin of safety may be provided for new designs using new technologies with which designers may be unfamiliar, reducing the need to revise designs to meet ESD-tolerance requirements.

Features of embodiments may be understood by way of one or more of the following examples:

Example 1: An electronic switching device includes an input terminal, an output terminal, and first and second field effect transistors. The first field effect transistor (FET) has a first current terminal, a second current terminal, a channel region between the first current terminal and the second current terminal, and a body region. The first FET is configured to provide a first conductive current path between the input terminal and the second current terminal of the first FET via the channel region of the first FET. The second FET is connected in series with the first FET between the input terminal and the output terminal and has a first current terminal, a second current terminal, a channel region between the first current terminal and the second current terminal of that FET, and a body region. The second FET is configured to provide a second conductive current path between the second current terminal of the first FET and the output terminal via the channel region of the second FET. The electronic switching device of Example 1 includes a first electrostatic discharge (ESD) protection circuit electrically coupled to the first current terminal of the first FET and the body region of the first FET; and a second ESD protection circuit electrically coupled to the first current terminal of the second FET and the body region of the second FET.

In some examples, the first and second ESD protection circuits of Example 1 are passive circuits that include respective first and second voltage-controlled current source (VCCS) elements. In some such examples, each of the first and second VCCS element is configured to output electric current according to a non-linear relationship between applied voltage and current having an inflection point at a predetermined threshold voltage.

Example 2: The device of Example 1, in which the first ESD protection circuit includes a first set of diodes connected in series between the first current terminal of the first FET and the body region of the first FET. The diodes of the first set of diodes are oriented to pass current from the first current terminal of the first FET toward the body region of the first FET. The device further includes a second ESD protection circuit including a second set of diodes connected in series between the first current terminal of the second FET and the body region of the second FET. The diodes of the second set of diodes are oriented to pass current from the first current terminal of the second FET toward the body region of the second FET.

Example 3: The device of either of Examples 1-2, in which the first ESD protection circuit further includes a third set of diodes connected in series between the second current terminal of the first FET and the body region of the first FET. The diodes of the third set of diodes are oriented to pass current from the second current terminal of the first FET toward the body region of the first FET. In this example the second ESD protection circuit also includes a fourth set of diodes connected in series between the second current terminal of the second FET and the body region of the second FET. The diodes of the fourth set of diodes are oriented to pass current from the second current terminal of the second FET toward the body region of the second FET.

Example 4: The device of any of Examples 1-3, in which the diodes and the FETs of the electronic switching device are configured such that the electronic switching device is configured to withstand a peak ESD current of at least 1.5 Amperes flowing the input terminal to the output terminal without sustaining damage.

Example 5: The device of any of Examples 1-4, in which the electronic switching device has a switching figure of merit defined by a product of an on-state resistance measured between the input terminal and the output terminal of the electronic switching device with an off-state capacitance of the electronic switching device measured between the input terminal and the output terminal that is less than or equal to 350 femtoseconds.

Example 6: The device of any of Examples 1-5, in which in which the electronic switching device has a switching figure of merit defined by a product of an on-state resistance measured between the input terminal and the output terminal of the electronic switching device with an off-state capacitance of the electronic switching device measured between the input terminal and the output terminal that is less than or equal to 100 femtoseconds.

Example 7: The device of any of Examples 1-6, in which the first and second FETs and the first and second sets of diodes are formed within a single semiconductor substrate.

Example 8: The device of any of Examples 1-7, in which, when the electronic switching device is exposed to a voltage greater than a first predetermined voltage at the input terminal measured relative to an electric potential of the output terminal, the first ESD protection circuit is configured to cause an electric current to flow between the first current terminal of the of the first FET and the second current terminal of the first FET via the body region of the first FET. The second ESD protection circuit is configured to cause an electric current to flow between the first current terminal of the second FET and the second current terminal of the second FET via the body region of the second FET.

Example 9: The device of any of Examples 1-8, in which the first conductive current path has a first electrical conductivity and the second conductive current path has a second electrical conductivity. When the electronic switching device is exposed to the voltage greater than the first predetermined voltage at the input terminal measured relative to an electric potential of the output terminal, the first FET is configured to provide a third conductive current path between the input terminal and the second current terminal of the first FET via the body region of the first FET. The third conductive current path has a third electrical conductivity that is greater the first electrical conductivity. When the electronic switching device is exposed to the voltage greater than the first predetermined voltage at the input terminal measured relative to an electric potential of the output terminal, the second FET is configured to provide a fourth conductive current path between the second current terminal of the second FET and the output terminal via the body region of the second FET. The fourth conductive current path has a fourth electrical conductivity that is greater than the second electrical conductivity.

Example 10: The device of any of Examples 1-9, in which the first current terminal, the second current terminal, and the body region of the first FET are configured and arranged to form a parasitic first bipolar junction transistor (BJT). The body region of the first FET corresponds to a base of the first BJT, and the first and second current terminals of the first FET correspond to first and second current terminals of the first BJT. The first current terminal, the second current terminal, and the body region of the second FET are arranged to form a parasitic second BJT. The body region of the second FET corresponds to a base of the second BJT, and the first and second current terminals of the second FET correspond to first and second current terminals of the second BJT. When the electronic switching device is exposed to the voltage greater than the first predetermined voltage at the input terminal measured relative to an electric potential of the output terminal, the first and second ESD protection circuits are configured to bias the base of the first BJT and the base of the second BJT such that the first and second BJTs are in an on state that allows current to flow from the first current terminal of each BJT to the second current terminal of that BJT via the body region of the corresponding FET.

Example 11: The device of any of Examples 1-10, further including a third FET connected in series between the first FET and the second FET and a third ESD protection circuit. The third FET has a first current terminal, a second current terminal, a channel region between the first current terminal and the second current terminal, and a body region. The third FET is configured to provide a conductive current path between the first current terminal of the third FET and the second terminal of the third FET via the channel region of the third FET. Th third ESD protection circuit is electrically coupled to the first current terminal of the third FET and the body region of the third FET. The third ESD protection circuit includes a third set of diodes connected in series between the first current terminal of the third FET and the body region of the third FET. The diodes of the third set of diodes are oriented to pass current from the first current terminal of the third FET toward the body region of the third FET.

Example 12: An electronic switching device includes an input terminal, an output terminal, and first and second field effect transistors. The first field effect transistor (FET) has a first current terminal, a second current terminal, a channel region between the first current terminal and the second current terminal, and a body region. The first FET is configured to provide a first conductive current path between the input terminal and the second current terminal of the first FET via the channel region of the first FET. The second FET is connected in series with the first FET between the input terminal and the output terminal and has a first current terminal, a second current terminal, a channel region between the first current terminal and the second current terminal of that FET, and a body region. The second FET is configured to provide a second conductive current path between the second current terminal of the first FET and the output terminal via the channel region of the second FET. The electronic switching device of Example 13 includes a first electrostatic discharge (ESD) protection circuit electrically coupled between both of the first and second current terminals of the first FET and the body region of the first FET. The electronic switching device of Example 13 also includes a second ESD protection circuit coupled between the first and second current terminals of the second FET and the body region of the second FET.

Example 13: The device of Example 12, in which the first ESD circuit includes first and second sets of diodes and the second ESD protection circuit includes third and fourth sets of diodes. The diodes of the first set of diodes are connected in series between the first current terminal of the first FET and the body region of the first FET and are oriented to pass current from the first current terminal of the first FET toward the body region of the first FET. The diodes of the second set of diodes are connected in series between the second current terminal of the first FET and the body region of the first FET and oriented to pass current from the second current terminal of the first FET toward the body region of the first FET. The diodes of the third set of diodes are connected in series between the first current terminal of the second FET and the body region of the second FET and oriented to pass current from the first current terminal of the second FET toward the body region of the second FET. The diodes of the fourth set of diodes are connected in series between the second current terminal of the second FET and the body region of the second FET and oriented to pass current from the second current terminal of the second FET toward the body region of the second FET.

Example 14: The device of either of Examples 12-13, in which, when the electronic switching device is exposed to a voltage greater than a first predetermined voltage at the input terminal measured relative to an electric potential of the output terminal, the first ESD protection circuit is configured to cause electric current to flow in a first direction between the first current terminal of the of the first FET and the second current terminal of the first FET via the body region of the first FET; and the he second ESD protection circuit is configured to cause electric current to flow in the first direction between the first current terminal of the second FET and the second current terminal of the second FET via the body region of the second FET. When the electronic switching device is exposed to a voltage greater than a second predetermined voltage at the output terminal measured relative to an electric potential of the input terminal, the first ESD protection circuit is configured to cause electric current to flow in a second direction opposite the first direction between the second current terminal of the of the first FET and the first current terminal of the first FET via the body region of the first FET; and the second ESD protection circuit is configured to cause electric current to flow in the second direction between the second current terminal of the second FET and the first current terminal of the second FET via the body region of the second FET.

Example 15: The device of any of Examples 12-14, in which the diodes and the FETs are configured such that the switching device is configured to withstand a peak ESD current of at least 1.5 Amperes flowing from the input terminal to the output terminal without sustaining damage and to withstand a peak ESD current of at least 1.5 Amperes flowing from the output terminal to the input terminal without sustaining damage.

Example 16: The device of any of Examples 12-15, in which the electronic switching device has a switching figure of merit defined by a product of an on-state resistance measured between the input terminal and the output terminal of the electronic switching device with an off-state capacitance of the electronic device measured between the input terminal and the output terminal that is less than or equal to 350 femtoseconds.

Example 17: The device of any of Examples 12-16, in which the electronic switching device has a switching figure of merit defined by a product of an on-state resistance measured between the input terminal and the output terminal of the electronic switching device with an off-state capacitance of the electronic device measured between the input terminal and the output terminal that is less than or equal to 100 femtoseconds.

Example 18: The device of any of Examples 12-17, in which the device includes a third FET in series between the first and second FETs and a third ESD protection circuit. The third FET has a first current terminal, a second current terminal, a channel region between the first current terminal and the second current terminal, and a body region. The third FET configured to provide a third conductive current path between first current terminal of third FET and the second current terminal of the third FET via the channel region of the third FET. The third ESD protection circuit is electrically coupled between both of the first and second current terminals of the third FET and the body region of the third FET.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

As used herein, a "node" or "terminal" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

We claim:

1. An electronic switching device comprising:
   an input terminal;
   an output terminal;
   at least a first field effect transistor (FET) having a first current terminal, a second current terminal, a channel region between the first current terminal and the second current terminal, and a body region; the first FET configured to provide a first conductive current path between the input terminal and the second current terminal of the first FET via the channel region of the first FET;
   at least a second field effect transistor (FET) connected in series with the first FET between the input terminal and the output terminal; the second FET having a first current terminal, a second current terminal, a channel region between the first current terminal and the second current terminal, and a body region; the second FET configured to provide a second conductive current path between the second current terminal of the second FET and the output terminal via the channel region of the second FET;

a first electrostatic discharge (ESD) protection circuit electrically coupled to the first current terminal of the first FET and the body region of the first FET; and a second ESD protection circuit electrically coupled to the first current terminal of the second FET and the body region of the second FET;

wherein the first and second ESD protection circuits are passive circuits that include respective first and second voltage-controlled current source (VCCS) elements; and wherein each of the first and second VCCS element is configured to output electric current according to a non-linear relationship between applied voltage and current having an inflection point at a predetermined threshold voltage.

2. The electronic switching device of claim 1, wherein the first ESD protection circuit includes a first set of diodes connected in series between the first current terminal of the first FET and the body region of the first FET and oriented to pass current from the first current terminal of the first FET toward the body region of the first FET; and wherein the second ESD protection circuit includes a second set of diodes connected in series between the first current terminal of the second FET and the body region of the second FET and oriented to pass current from the first current terminal of the second FET toward the body region of the second FET.

3. The electronic switching device of claim 2, wherein the first ESD protection circuit includes a third set of diodes connected in series between the second current terminal of the first FET and the body region of the first FET and oriented to pass current from the second current terminal of the first FET toward the body region of the first FET; and wherein the second ESD protection circuit includes a fourth set of diodes connected in series between the second current terminal of the second FET and the body region of the second FET and oriented to pass current from the second current terminal of the second FET toward the body region of the second FET.

4. The electronic switching device of claim 2, wherein the diodes and the FETs are configured such that the electronic switching device is configured to withstand a peak ESD current of at least 1.5 Amperes flowing the input terminal to the output terminal without sustaining damage.

5. An electronic switching device comprising:

an input terminal;

an output terminal;

at least a first field effect transistor (FET) having a first current terminal, a second current terminal, a channel region between the first current terminal and the second current terminal, and a body region; the first FET configured to provide a first conductive current path between the input terminal and the second current terminal of the first FET via the channel region of the first FET;

at least a second field effect transistor (FET) conneted in series with the first FET between the input terminal and the output terminal; the second FET having a first current terminal, a second current terminal, a channel region between the first current terminal and the second current terminal, and a body region; the second FET configured to provide a second conductive current path between the second current terminal of the second FET and the output terminal via the channel region of the second FET;

a first electrostatic dishcarge (ESD) protection circuit electrically coupled between the first current terminal of the first FET and the body region of the first FET; and a second ESD protection circuit electrically coupled between the first current terminal of the second FET and the body region of the second FET;

wherein the electronic switching device has a switching figure of merit defined by a product of an on-state resistance measured between the input terminal and the output terminal of the electronic switching device with an off-state capacitance of the electronic switching device measured between the input terminal and the output terminal that is less than or equal to 350 femtoseconds.

6. The electronic switching device of claim 5, wherein the switching figure of merit defined by the product of the on-state resistance of the electronic switching device measured between the input terminal and the output terminal with the off-state capacitance of the electronic device measured between the input terminal and the output terminal that is less than or equal to 100 femtoseconds.

7. The electronic switching device of claim 2, wherein the first and second FETs and the first and second sets of diodes are formed within a single semiconductor substrate.

8. An electronic switching device comprising:

an input terminal;

an output terminal;

at least a first field effect transistor (FET) having a first current terminal, a second current terminal, a channel region between the first current terminal and the second current terminal, and a body region; the first FET configured to provide a first conductive current path between the input terminal and the second current terminal of the first FET via the channel region of the first FET;

at least a second field effect transistor (FET) connected in series with the first FET between the input terminal and the output terminal; the second FET having a first current terinal, a second current terminal, a channel region between the first current terminal and the second current terminal, and a body region; the second FET configured to provide a second conductive current path between the second current terminal of the second FET and the output terminal via the channel region of the second FET;

a first electrostatic discharge (ESD) protection circuit electrically coupled to the first current terminal of the first FET and the body region of the first FET; and a second ESD protection circuit electrically coupled to the first current terminal of the second FET and the body region of the second FET;

wherein, when the electronic switching device is exposed to a voltage greater than a first predetermined voltage at the input terminal measured relative to an electric potential of the output terminal:

the first ESD protection circuit is configured to cause an electric current to flow between the first current terminal of the of the first FET and the second current terminal of the first FET via the body region of the first FET; and the second ESD protection circuit is configured to cause an electric current to flow between the first current terminal of the second FET and the second current terminal of the second FET via the body region of the second FET.

9. The electronic switching device of claim 8,
wherein the first conductive current path has a first electrical conductivity and the second conductive current path has a second electrical conductivity; and
wherein, when the electronic switching device is exposed to the voltage greater than the first predetermined voltage at the input terminal measured relative to an electric potential of the output terminal:
the first FET is configured to provide a third conductive current path between the input terminal and the second current terminal of the first FET via the body region of the first FET, the third conductive current path having a third electrical conductivity that is greater the first electrical conductivity; and
the second FET is configured to provide a fourth conductive current path between the second current terminal of the second FET and the output terminal via the body region of the second FET, the fourth conductive current path having a fourth electrical conductivity that is greater than the second electrical conductivity.

10. The electronic switching device of claim 8,
wherein the first current terminal, the second current terminal, and the body region of the first FET are configured and arranged to form a parasitic first bipolar junction transistor (BJT) in which the body region of the first FET corresponds to a base of the first BJT, and the first and second current terminals of the first FET correspond to first and second current terminals of the first BJT;
wherein the first current terminal, the second current terminal, and the body region of the second FET are arranged to form a parasitic second BJT in which the body region of the second FET corresponds to a base of the second BJT, and the first and second current terminals of the second FET correspond to first and second current terminals of the second BJT; and
wherein, when the electronic switching device is exposed to the voltage greater than the first predetermined voltage at the input terminal measured relative to an electric potential of the output terminal, the first and second ESD protection circuits are configured to bias the base of the first BJT and the base of the second BJT such that the first and second BJTs are in an on state that allows current to flow from the first current terminal of each BJT to the second current terminal of that BJT via the body region of the corresponding FET.

11. The electronic switching device of claim 8, wherein the ESD protection circuits and the FETs are configured such that the switching device is configured to withstand a peak ESD current of at least 1.5 Amperes flowing from the input terminal to the output terminal without sustaining damage and to withstand a peak ESD current of at least 1.5 Amperes flowing from the output terminal to the input terminal without sustaining damage.

12. The electronic switching device of claim 1, further comprising:
at least a third field effect transistor (FET) connected in series between the first FET and the second FET; the third FET having a first current terminal, a second current terminal, a channel region between the first current terminal and the second current terminal, and a body region; the third FET configured to provide a third conductive current path between the first current terminal of the third FET and the second terminal of the third FET via the channel region of the third FET; and a third ESD protection circuit electrically coupled to the first current terminal of the third FET and the body region of the third FET;
wherein the first ESD protection circuit includes a first set of diodes connected in series between the first current terminal of the first FET and the body region of the first FET and oriented to pass current from the first current terminal of the first FET toward the body region of the first FET;
wherein the second ESD protection circuit includes a second set of diodes connected in series between the first current terminal of the second FET and the body region of the second FET and oriented to pass current from the first current terminal of the second FET toward the body region of the second FET; and
wherein the third ESD protection circuit includes a third set of diodes connected in series between the first current terminal of the third FET and the body region of the third FET and oriented to pass current from the first current terminal of the third FET toward the body region of the third FET.

13. An electronic switching device comprising:
an input terminal;
an output terminal;
at least a first field effect transistor (FET) having a first current terminal, a second current terminal, a channel region between the first current terminal and the second current terminal, and a body region; the first FET configured to provide a first conductive current path between the input terminal and the second current terminal of the first FET via the channel region of the first FET;
at least a second field effect transistor (FET) connected in series with the first FET between the input terminal and the output terminal; the second FET having a first current terminal, a second current terminal, a channel region between the first current terminal and the second current terminal, and a body region; the second FET configured to provide a second conductive current path between the second current terminal of the first FET and the output terminal via the channel region of the second FET;
at least a third FET in series between the first and second FETs and having a first current terminal, a second current terminal, a channel region between the first current terminal and the second current terminal, and a body region; the third FET configured to provide a third conductive current path between first current terminal of third FET and the second current terminal of the third FET via the channel region of the third FET;
a first electrostatic discharge (ESD) protection circuit electrically coupled between both of the first and second current terminals of the first FET and the body region of the first FET;
a second ESD protection circuit electrically coupled between both of the first and second current terminals of the second FET and the body region of the second FET; and
a third ESD protection circuit electrically coupled between both of the first and second current terminals of the third FET and the body region of the third FET.

14. The electronic switching device of claim 13
wherein the first ESD protection circuit includes:
a first set of diodes connected in series between the first current terminal of the first FET and the body region of the first FET and oriented to pass current from the first current terminal of the first FET toward the body region of the first FET; and a second set of diodes connected in series between the second current terminal of the first FET and the body region of the first FET and oriented to pass current from the second current terminal of the first FET toward the body region of the first FET; and wherein the second ESD protection circuit includes:

a third set of diodes connected in series between the first current terminal of the second FET and the body region of the second FET and oriented to pass current from the first current terminal of the second FET toward the body region of the second FET; and a fourth set of diodes connected in series between the second current terminal of the second FET and the body region of the second FET and oriented to pass current from the second current terminal of the second FET toward the body region of the second FET.

15. The electronic switching device of claim 14, wherein, when the electronic switching device is exposed to a voltage greater than a first predetermined voltage at the input terminal measured relative to an electric potential of the output terminal:

the first ESD protection circuit is configured to cause electric current to flow in a first direction between the first current terminal of the of the first FET and the second current terminal of the first FET via the body region of the first FET; and the second ESD protection circuit is configured to cause electric current to flow in the first direction between the first current terminal of the second FET and the second current terminal of the second FET via the body region of the second FET; and wherein, when the electronic switching device is exposed to a voltage greater than a second predetermined voltage at the output terminal measured relative to an electric potential of the input terminal:

the first ESD protection circuit is configured to cause electric current to flow in a second direction opposite the first direction between the second current terminal of the of the first FET and the first current terminal of the first FET via the body region of the first FET; and the second ESD protection circuit is configured to cause electric current to flow in the second direction between the second current terminal of the second FET and the first current terminal of the second FET via the body region of the second FET.

16. The electronic switching device of claim 15, wherein the diodes and the FETs are configured such that the switching device is configured to withstand a peak ESD current of at least 1.5 Amperes flowing from the input terminal to the output terminal without sustaining damage and to withstand a peak ESD current of at least 1.5 Amperes flowing from the output terminal to the input terminal without sustaining damage.

17. The electronic switching device of claim 16, wherein the electronic switching device has a switching figure of merit defined by a product of an on-state resistance measured between the input terminal and the output terminal of the electronic switching device with an off-state capacitance of the electronic device measured between the input terminal and the output terminal that is less than or equal to 350 femtoseconds.

18. The electronic switching device of claim 16, wherein the electronic switching device has a switching figure of merit defined by a product of an on-state resistance measured between the input terminal and the output terminal of the electronic switching device with an off-state capacitance of the electronic device measured between the input terminal and the output terminal that is less than or equal to 100 femtoseconds.

* * * * *